(12) United States Patent
Kubota et al.

(10) Patent No.: US 6,369,845 B1
(45) Date of Patent: Apr. 9, 2002

(54) EXPOSURE SYSTEM FOR RECORDING MEDIA

(75) Inventors: Masanori Kubota; Ayako Kubota; Munetaka Kubota, all of Hockessin, DE (US)

(73) Assignee: Kubota Research Associates Inc., Hockessin, DE (US)

( * ) Notice: Subject to any disclaimer, the term of this patent is extended or adjusted under 35 U.S.C. 154(b) by 0 days.

(21) Appl. No.: 09/625,335

(22) Filed: Jul. 25, 2000

Related U.S. Application Data

(60) Provisional application No. 60/189,229, filed on Mar. 14, 2000.

(51) Int. Cl.[7] ................................................ B41J 27/00
(52) U.S. Cl. ........................................ 347/258; 347/244
(58) Field of Search ................................ 347/224, 241, 347/243, 244, 256, 258, 259; 355/32; 359/305, 363, 641; 430/356; 600/310

(56) References Cited

U.S. PATENT DOCUMENTS

| | | | |
|---|---|---|---|
| 4,940,314 A | 7/1990 | Hecht | 359/276 |
| 5,247,180 A | 9/1993 | Mitcham et al. | 250/492.1 |
| 5,296,958 A | 3/1994 | Roddy et al. | 359/204 |
| 5,384,618 A * | 1/1995 | Schurman et al. | 355/32 |
| 5,385,092 A | 1/1995 | Lewis et al. | 101/467 |
| 5,506,614 A | 4/1996 | Fisli | 347/241 |
| 5,557,315 A * | 9/1996 | Meyers et al. | 347/244 |
| 5,580,698 A | 12/1996 | Anderson | 430/308 |
| 5,589,870 A | 12/1996 | Curry et al. | 347/233 |
| 5,625,403 A | 4/1997 | Hazman | 347/239 |
| 5,719,617 A | 2/1998 | Takahashi et al. | 347/241 |
| 5,781,225 A | 7/1998 | Syracuse et al. | 347/258 |
| 5,785,651 A * | 7/1998 | Kuhn et al. | 600/310 |
| 6,118,574 A * | 9/2000 | Imanishi et al. | 359/305 |

FOREIGN PATENT DOCUMENTS

WO     WO99/28789     6/1999

* cited by examiner

*Primary Examiner*—Hai Pham
(74) *Attorney, Agent, or Firm*—Ratner & Prestia

(57) ABSTRACT

A method and apparatus for exposing photosensitive recording material is presented. The invention provides for using chromatic lenses to focus polychromatic light onto recording media. The resulting chromatic aberrations contribute to exposing recording media in three dimensions. The method and apparatus presented also provide for improved quantum efficiency in the exposure of photosensitive recording material.

10 Claims, 5 Drawing Sheets

EXPOSURE SYSTEM FOR RECORDING MEDIA

The application claims benefit of Provisional No. 60/189,229 filed Mar. 14, 2000.

BACKGROUND OF THE INVENTION

1. Field of the Invention

The present invention relates in general to a method for recording information on optically sensitive media, and more particularly to a method suitable for recording information on proofing and lithographic printing plates.

2. Description of Related Art

Traditional techniques of introducing an image onto recording media include photoresist, color proofing, letterpress printing, flexographic printing, gravure printing and offset printing. These traditional techniques use various light sources to expose photosensitive materials with analogue lithographic masking film technology. The quality of exposure contributes to the resolution, durability and overall condition of the image in the final products.

Digitally modulated lasers are typically used to expose recording media. Lasers have been the preferred light source for digital imaging devices because they provide collimated, monochromatic emission. Collimated single wavelength light beams are easy to modulate and do not suffer from chromatic aberrations, thus eliminating the need for sophisticated achromatic optics. Collimated single wavelength light, however, has some drawbacks in the application of recording information on optically sensitive media.

Most photosensitive recording materials form three-dimensional layers with a discrete thickness. For example, in offset printing plates the photosensitive materials are typically coated as layers 0.5–10 micron thick on a substrate, and flexographic printing plates are coated or extruded as a 1–7 mm thick layer on a substrate. Although the recording media is a three-dimensional layer, the monochromatic light sources typically used to photo-expose the recording media generate a substantially two-dimensional focal point, as schematically shown in FIG. 1. A laser light source 14 is focused through a chromatic lens 16 onto a photosensitive layer 12. The monochromatic light is focused to a two-dimensional focal point 18 at the surface of the photosensitive layer 12. A two-dimensional single focal point optimally exposes only one level in the three-dimensional photosensitive layer. In practice, the two-dimensional focal point is typically projected at the surface of the layer of photosensitive material, and the photosensitive material below the surface is not sufficiently photo-exposed.

There are many problems associated with insufficient photo-exposure below the surface of the photosensitive layer.

Insufficient photo-exposure results in inadequate initiation of the photochemical reaction in the recording medium. The photochemical reaction cures the recording medium and the reaction is the foundation for all the subsequent processes in printing applications. The practical implications of insufficient photochemical reaction in the recording material include poor printing run length, poor ink receptivity, side etching and poor bonding to the substrate.

Since photo-exposure of recording media is so critical in printing applications, many adaptations have been made to optimize the photo-exposure process. One adaptation is the use of short wavelength light sources. Short wavelength radiation has higher energy to initiate the photochemical reaction in recording materials. Shorter wavelengths of light also provide higher resolution capability than longer wavelengths. However, short wavelength radiation does not penetrate well below the surface of the photosensitive material. Shorter wavelengths of light reflect off the surface of recording media more than light of longer wavelength. Higher reflectance off the surface leaves less radiation available to photo-initiate the desired chemical reaction.

In addition to exhibiting a greater degree of reflection, short wavelength light also refracts more than longer wavelengths. Greater refraction has two effects that contribute to poor photo-exposure of recording media. The shorter wavelengths lose more energy through lens interference because they have a longer path through the lens material than the longer, less refracted wavelengths. Also, the highly refracted shorter wavelengths of light angle sharply from the focusing lens to the focal point, so light penetration is very shallow. As a result, highly refracted light does not pass through photosensitive material below the surface.

In addition to poor penetration below the surface of the recording material, lasers have other shortcomings as exposure sources in digital imaging. Photosensitive recording materials have polychromatic photosensitivity. Many photosensitive recording media have broad spectral sensitivity, and absorb monochromatic radiation with relatively low quantum efficiency. The photochemical reaction may be initiated with a range of wavelengths, and when only a single wavelength is used, photo-initiation is very inefficient. In order to combat low quantum efficiency, very high intensities are required. High intensity radiation can saturate single absorption bands, which causes failure of the reciprocity law. The practical consequences of absorption band saturation relevant to printing applications include halation, fog and poor resolution in the printed image.

In order to avoid the difficulties with high intensity radiation an ideal light source would have spectral emission similar to the spectral sensitivity of the material. Such spectral overlap could be achieved with an appropriate polychromatic light source. Polychromatic light sources have been used in combination with achromatic lenses to expose photosensitive recording media. Achromatic lenses correct for chromatic aberrations, which are caused from the various wavelengths of light from polychromatic sources. Achromatic optics combine optical elements with low and high indices of refraction to correct for chromatic aberrations. Achromatic lenses focus light with no chromatic aberration so that all the wavelengths of polychromatic light focus at the same focal point. Because achromatic lenses focus all wavelengths of light to a two-dimensional focal point, this exposure method also provides insufficient photo-initiation for the recording material below the surface of the layer.

An illumination method that facilitates polychromatic exposure of a layer of photosensitive material from the surface to the substrate would alleviate many of the aforementioned problems in printing applications.

SUMMARY OF THE INVENTION

Polychromatic light sources provide efficient energy in terms of quantum absorption for photosensitive recording media, but achromatic lenses focus the polychromatic light to a single two-dimensional focal point, which prevents exposure of the photosensitive material below the surface of the three-dimensional layer. The present invention takes advantage of the spectral breadth and focal point distribution provided by polychromatic light sources. As a result of these attributes, polychromatic light sources have higher quantum efficiency and permeate deeper below the surface of photosensitive recording media than monochromatic light sources.

Therefore, it is an object of the present invention to provide an illumination method by which polychromatic light intensity can be distributed in a three-dimensional focal point onto recording media.

The above object is obtained by a method for exposing a three-dimensional layer of recording media with an imaging system. The imaging system comprising a polychromatic light source that provides radiation to an optical modulator; the imaging system further including a system of achromatic optics and a chromatic lens along with the layer of recording media.

The method comprises modulating a light beam from the polychromatic light source with the optical modulator and collimating the light beam from the optical modulator with the system of achromatic optics. The method further comprises focusing the light beam from the system of achromatic optics with the chromatic lens and exposing the layer of recording media with the focused light beam from the chromatic lens.

The present invention also provides an imaging apparatus for exposing a three-dimensional layer of recording media. The imaging apparatus comprises a polychromatic light source, an optical modulator, a system of achromatic optics and a chromatic lens. The optical modulator modulates a light beam from the polychromatic light source and the system of achromatic optics collimates the modulated light beam. The chromatic lens focuses the light beam onto the layer of recording media.

BRIEF DESCRIPTION OF THE DRAWINGS

The invention can be more fully understood from the following description thereof in connection with the accompanying drawings described as follows.

DESCRIPTION OF THE PREFERRED EMBODIMENT(S)

Figure 1:
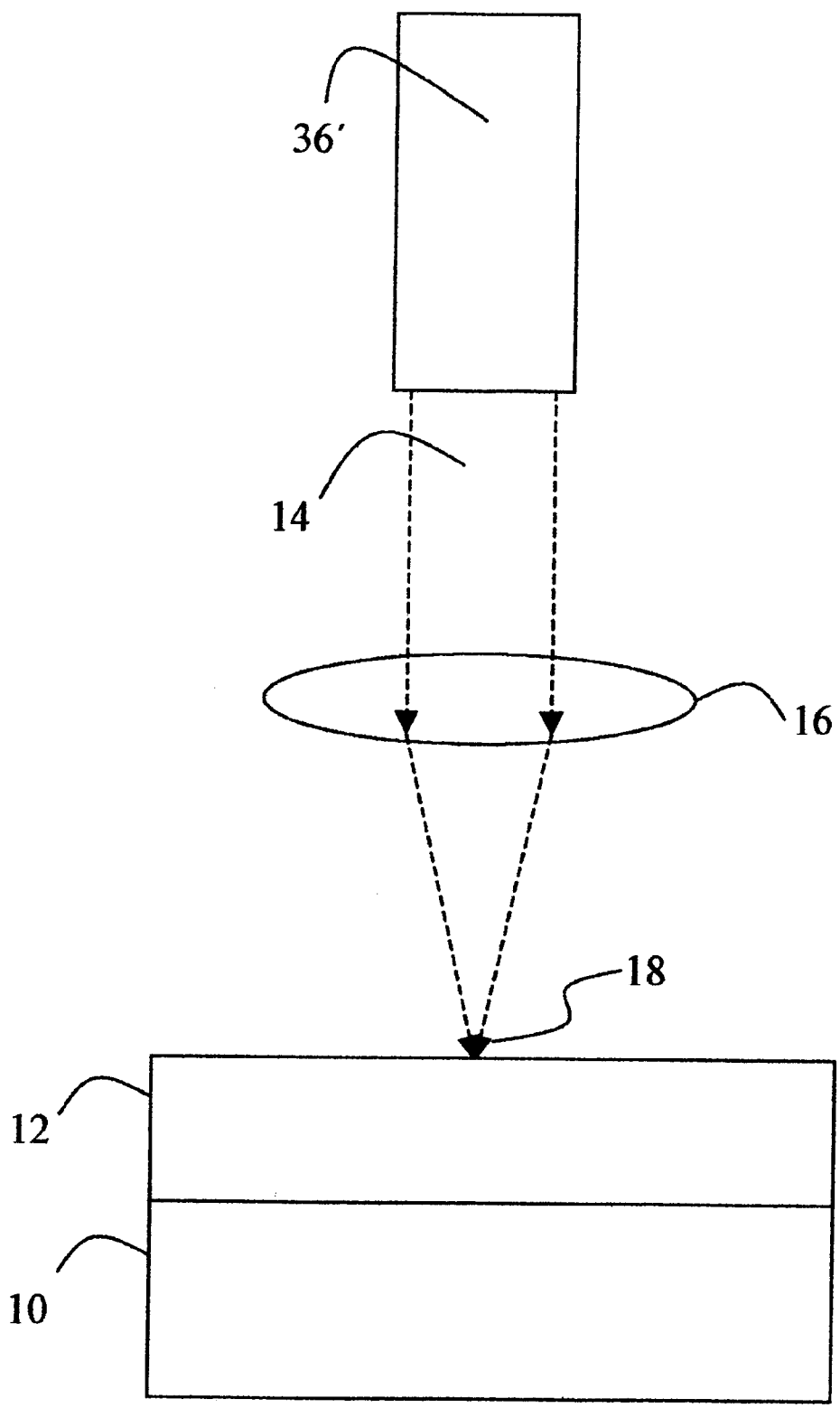
FIG. 1 schematically illustrates a two-dimensional focal point from a laser a three-dimensional photosensitive layer.

The method of illuminating photosensitive material offered by the present invention exploits the properties of polychromatic light in forming chromatic aberrations when focused. As used herein, the term "polychromatic light" refers to light of more than one wavelength, typically a continuous spectrum of wavelengths of different energy. Accordingly, the term "monochromatic light" refers to light of a single wavelength, such as light generated by laser sources. The term "chromatic lens" refers to an optical component of one or more optical elements that separates polychromatic light in a prism-like manner, with shorter wavelengths focusing closer to the lens than longer wavelengths. Polychromatic light focused with a chromatic lens results in chromatic aberrations, the continuous distribution of focal points between the shortest and longest wavelengths. The term "achromatized optics" refers to an optical component of more than one optical element that focuses all the wavelengths of polychromatic light at the same distance from the focusing lens. Polychromatic light focused with achromatized optics does not exhibit chromatic aberrations.

Throughout the following detailed description, similar reference characters refer to similar elements in all figures of the drawings.

Figure 2:
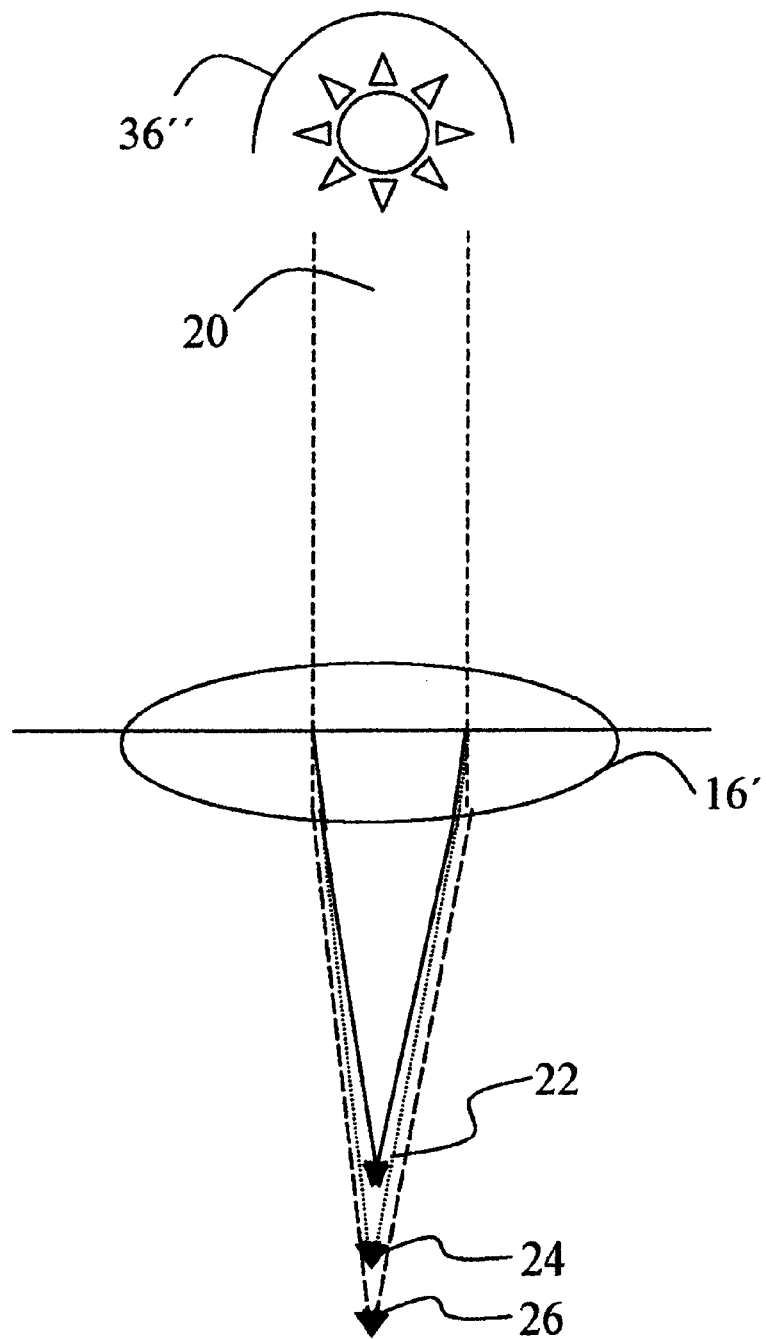
FIG. 2 schematically illustrates the wavelength dependence of light refraction, as shorter wavelengths have larger indexes of refraction than longer wavelengths of light.

Polychromatic light sources give rise to chromatic aberrations, which are caused by the differences in refraction of the various wavelengths of the spectrum. Shorter wavelengths have greater indices of refraction than longer wavelengths and this causes wavelengths of different energy to separate upon refraction by a lens. The effect of chromatic aberration is illustrated in FIG. 2. A polychromatic light beam 20 is focused by a chromatic lens 16' and the various wavelengths separate and are focused at different focal points 22, 24, 26. The shortest wavelengths have a focal point 22 closest to the lens. The longest wavelengths have a focal point 26 furthest from the focusing lens. The distribution of focal points between the longest and shortest wavelengths reflects the spectral distribution of the light source.

Figure 3:
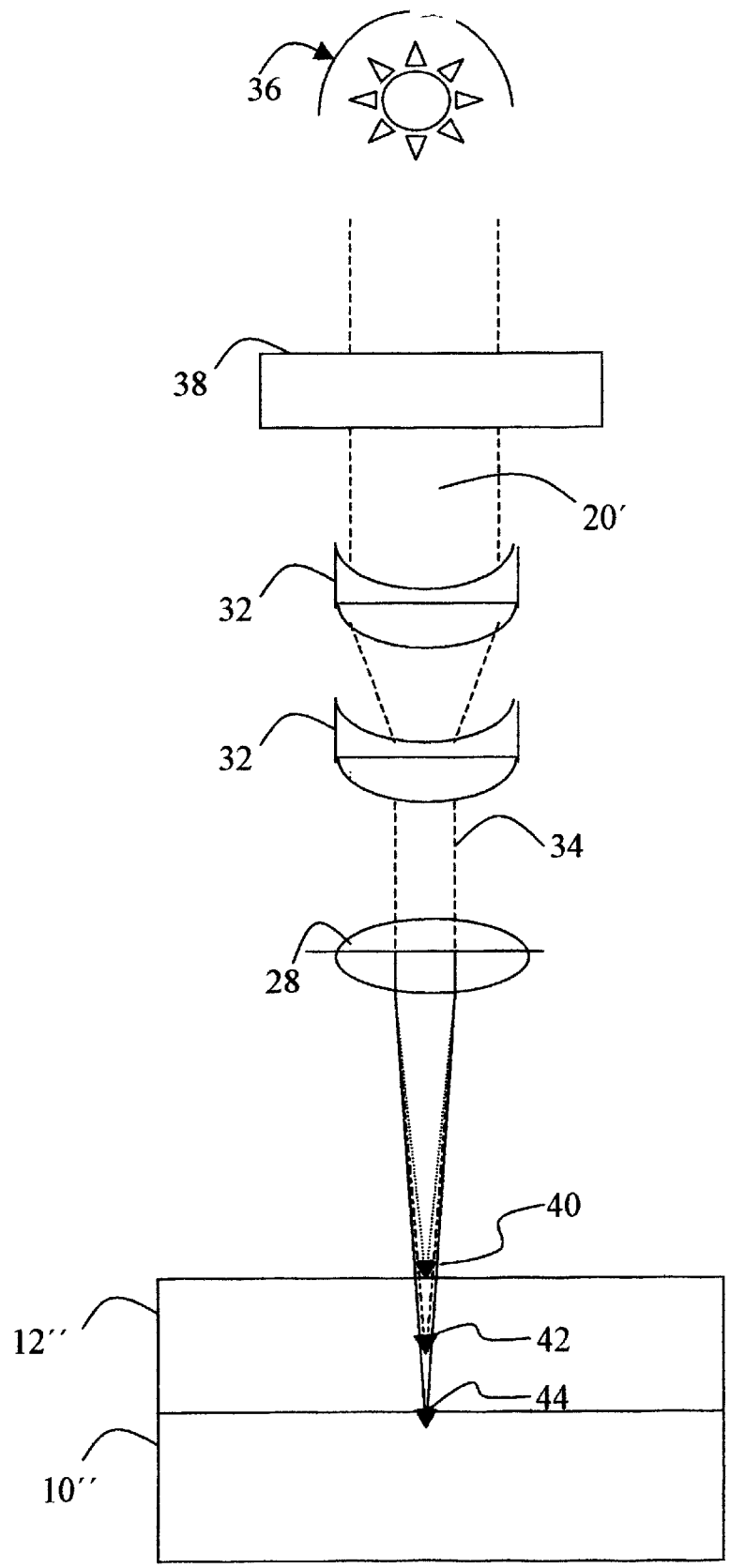
FIG. 3 schematically illustrates a preferred embodiment of a polychromatic illumination system assembled according to the present invention.

Referring to FIG. 3, the present invention provides a system to illuminate a three-dimensional photosensitive layer 12" which is deposited on a substrate 10". As shown, in FIG. 3 there is a polychromatic light source 36 having an optical modulator 38 for recording an image on the photosensitive medium 12". The preferred polychromatic light source is selected to compliment the spectral sensitivity of the recording media. Typically light sources with emissions in the UV/VIS region of the spectrum, such as the HI-IQ UV system manufactured by Fusion UV Systems Inc. are used. An acoustic optical modulator (AOM), an acoustic optical deflector (AOD) and fiber cupping all together, represented as an optical modulator 38, modulate the polychromatic light. The modulator 38 is chosen to correspond to the characteristics of the light source, modulation speed and the required size of the writing spot. In one preferred embodiment of the invention, the modulator is a Model ASM series, designed for UV, manufactured by InterAction Corp. Other modulators may be selected according to wavelength region and range specifications of the light source.

The illumination system illustrated in FIG. 3 shows the modulated polychromatic light beam 20' passing through an imaging system of achromatic optics 32 and a chromatic lens 28. The achromatic optics 32 aligns the beam while correcting for chromatic aberrations. Achromatic lenses are standard in the art and are commercially available from many manufacturers, such as Nikon, Hoya and Edmund Scientific Co. In one preferred embodiment of the present invention the achromatic lenses were made with a focal point distance of 100 mm, and were made with BK7-SF5 glass.

Achromatized optics typically comprises the combination of a high index or refraction lens and a low index of refraction lens. Some typical material combinations for use in making achromatized lenses are; BaF10-FD10, BaFN10-SF57, SSKN8-FD10, SSKN8-SF10, F2-K5-F2, F2-BK7-F2, in addition to other combinations.

Achromatic optics provides a light beam for the illumination application that includes all wavelengths of the light source emission in the same wavefront. Again referring to the system illustrated in FIG. 3, a chromatic lens 28 is next used to focus the beam from the achromatic optics. Chromatic lenses are the simplest kind of focusing lens, low cost and readily available for multiple applications. In one embodiment of the present invention a chromatic Plano-Convex (PCX) single lens made from BK7 glass with a focal point distance of 100 mm is used.

Chromatic lenses are not corrected for chromatic aberrations and thus the various wavelengths of light are focused at the various respective focal points 40,42 and 44 as illustrated in FIG. 3. The chromatic lens 28 is selected so that it focuses the light 34 such that the spectral emission of the light source is focused throughout the depth of the photosensitive layer 12".

The chromatic aberration effect of the chromatic lens 28 spreads the focal point of the light so that the light penetrates below the surface of the photosensitive material layer 12". The shorter wavelengths are focused closest to the lens 28, at the surface of the photosensitive material 12", as shown in FIG. 3. The focal points of the increasingly longer wavelengths penetrate below the surface into the layer of the photosensitive material. The longer wavelengths of light photo-initiate the recording material below the surface of the layer.

The longer wavelengths of light penetrate well below the surface of the recording material because of two complimentary phenomena; the longer focal points due to the chromatic aberration effect discussed above, as well as the reflection properties for longer wavelengths as compared to shorter wavelengths of light. Radiation of longer wavelengths exhibits less reflectance off the surface of the photosensitive layer than does shorter wavelengths. As the reflectance decreases, more radiation penetrates below the surface of the layer.

In addition to the above mentioned optical phenomena that support the use of polychromatic light sources in exposing photosensitive material, the use of polychromatic light benefits from the quantum efficiency in the absorption phenomenon. Polychromatic light sources provide a distribution of energy that can be optimized to substantially overlap with the absorption profile of the photosensitive material. An energy distribution, in contrast with monochromatic radiation, utilizes a variety of potential absorbers in the photosensitive material. Since quantum absorbers of various energies contribute to photo-activation, lower intensity of polychromatic light provides more extensive exposure as compared to higher intensity monochromatic light. Due to improved quantum efficiency provided with exposure polychromatic light sources, poor image quality due to quantum saturation of the photosensitive material is avoided. The method and apparatus of the current invention employ the benefits of the aforementioned optical and physical properties in exposing photosensitive material.

Figure 5:
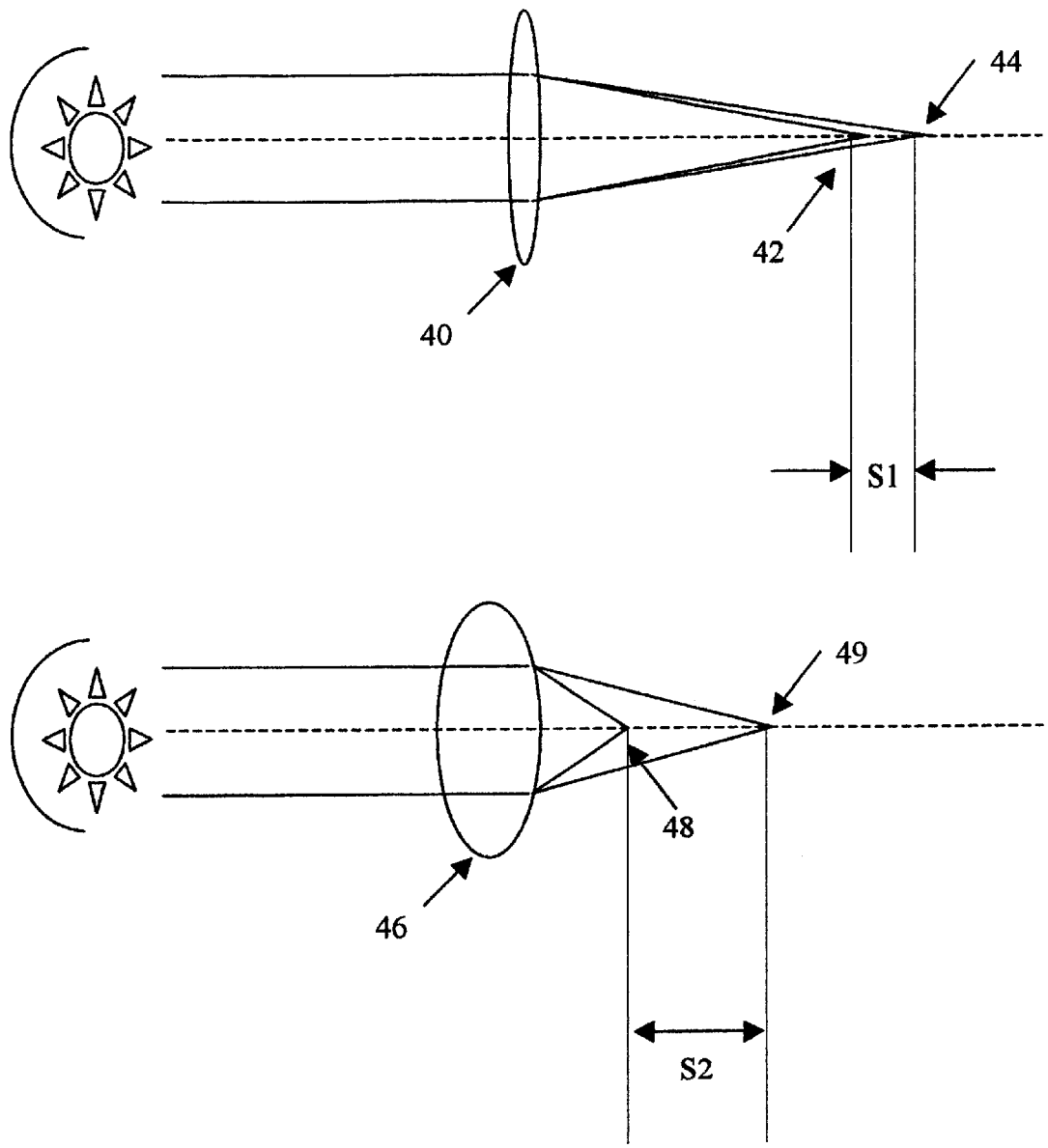
FIG. 5 schematically illustrates the chromatic aberration variation between chromatic lenses.

The chromatic lens specification determines the focal point penetration below the surface of the layer of photosensitive material. The distance between focal points from a polychromatic light source is a function of the chromatic lens index of refraction, as illustrated in FIG. 5. The thin lens 40 of FIG. 5 has a lower index of refraction than the thick lens 46. The distance S1 between the shortest focal length 42 and the longest focal length 44 of lens 40 is much less than the distance S2 provided by lens 46. The lengths S1 and S2 represent the maximum exposure length possible with their respective lenses. Exposure penetration can be optimized through appropriate selection of the index of refraction of the chromatic lens in accordance with the spectral profile of the light source. In accordance with the present invention, a chromatic lens may comprise two to three optical elements that somewhat correct for chromatic aberration, yet the focused light retains some chromatic aberration. The distance between the shortest focal length and the longest focal length the chromatic aberration of a lens may also be optimized using multiple optical components.

In operation, a photosensitive recording medium, which may be a flat surface or the surface of a drum having an outer photoconductive layer, is scanned (by means not shown) in two dimensions. It will be evident that there are other recording media that could be used, including photoconductively coated belts and plates, as well as photosensitive films and coated papers. Thus in the generalized case, the recording medium should be visualized as being a photosensitive medium which is exposed by a light source.

Figure 4:
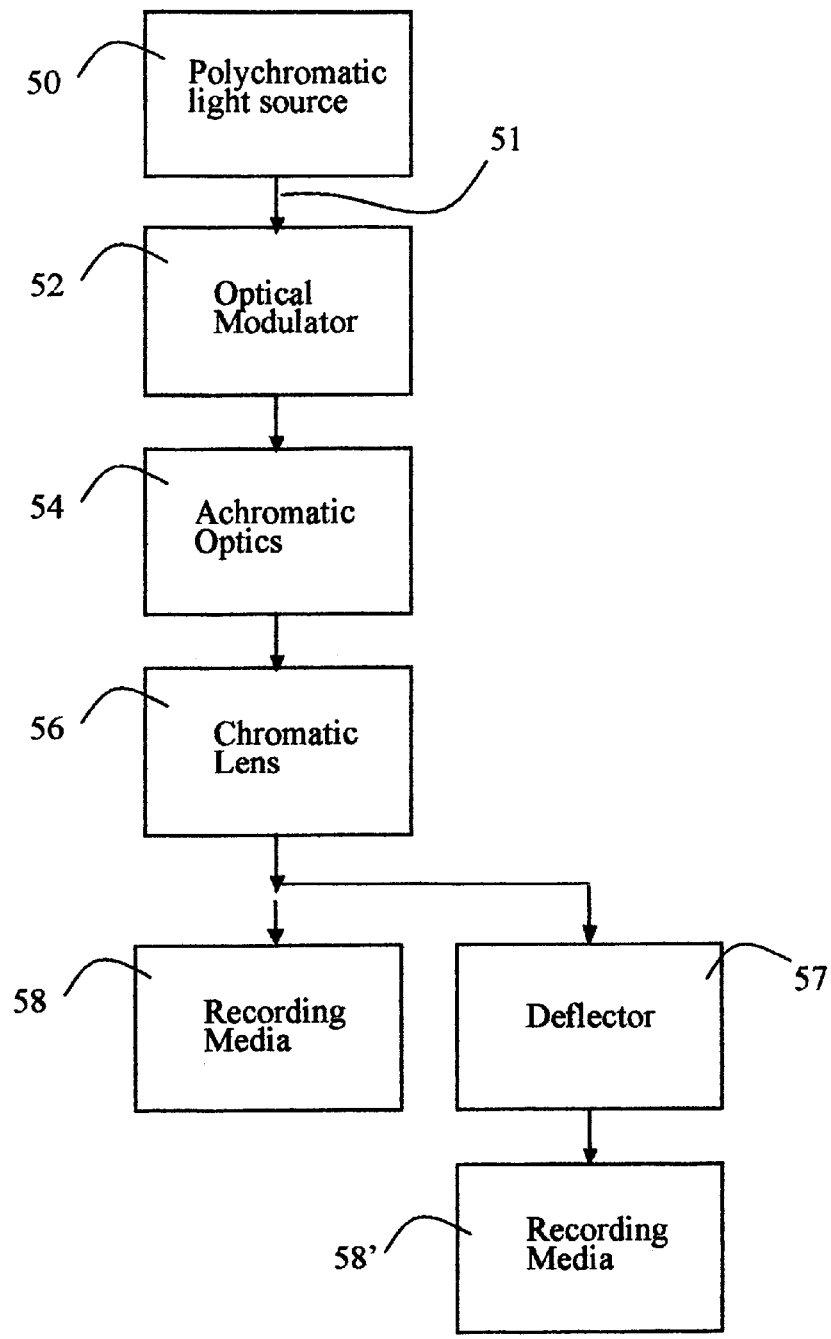
FIG. 4 a block diagram of an exposure system built in accordant with the present invention.

Now referring to the block diagram in FIG. 4 where the present invention is illustrated as an imaging system for a variety of photosensitive imaging processes. In the preferred embodiment of the present invention, the system for imaging on recording media requires a light source 50 that provides a beam 51 of polychromatic radiation. An optical modulator 52 is incorporated into the system to control the beam intensity. The achromatic optics 54 adjusts the light beam from the modulator to form a chromatically corrected beam.

The next element of the imaging system of the present invention is a chromatic lens 56. The chromatic lens 56 focuses the collimated light beam. Various embodiments of the present invention are possible. This imaging system can be used to expose recording media 58 directly, or in conjunction with any deflector system 57. The deflector system 57 may include a raster scanning system such as a drum, a mirror, or any deflector device in the illumination of photosensitive recording media 58'.

Another embodiment of the present invention is a method for exposing photosensitive material. The method comprises providing a beam of polychromatic light to an optical-modulator, modulating the beam and subsequently focusing the polychromatic beam with achromatic optics and thus providing a wavefront of radiation free of chromatic aberrations to a chromatic lens. The methods further comprises focusing the radiation beam with the chromatic lens onto photosensitive recording media, or a deflecting device which then directs the beam from the chromatic lens to photosensitive recording media.

Those having the benefit of the above description of my invention may provide numerous such modifications of the invention. These modifications are to be construed as being encompassed within the scope of the present invention as set forth in the appended claims wherein I claim:

1. A method for exposing a three-dimensional layer of recording media with an imaging system comprising a polychromatic light source that provides radiation to an optical modulator; the imaging system further including a system of achromatic optics and a chromatic lens along with said layer of recording media, the method comprising:

(a) modulating a polychromatic light beam from the polychromatic light source with the optical modulator;

(b) collimating the polychromatic light beam from the optical modulator with the system of achromatic optics;

(c) focusing the polychromatic light beam from the system of achromatic optics with the chromatic lens;

(d) exposing the layer of recording media with the focused polychromatic light beam from the chromatic lens.

2. The method according to claim 1 wherein the layer of recording media has a surface and the polychromatic light beam from the chromatic lens has a focal point distribution that extends from the surface of said layer of recording media to below the surface of the layer of recording media and through the entire layer of recording media.

3. The method according to claim 1 wherein the layer of recording media is a photosensitive material.

4. The method according to claim 1 wherein a deflector device directs light from the chromatic lens to the layer of recording media.

5. The method according to claim 4 wherein the deflector device is a mirror.

6. An imaging apparatus for exposing a three-dimensional layer of recording media comprising:

a) a polychromatic light source,
   b) an optical modulator,
   c) a system of achromatic optics and
   d) a chromatic lens
      wherein the optical modulator modulates a polychromatic light beam from the polychromatic light source, the system of achromatic optics collimates said modulated polychromatic light beam, and wherein the chromatic lens focuses the polychromatic light beam onto the layer of recording media.

7. The apparatus according to claim 6 wherein the layer of recording media has a surface and the polychromatic light beam from the chromatic lens has a focal point distribution that extends from the surface of said layer of recording media to below the surface of the layer of recording media and through the entire layer of recording media.

8. The apparatus according to claim 6 wherein the layer of recording media is photosensitive.

9. The apparatus according to claim 6 wherein a deflector device directs light from the chromatic lens to the layer of recording media.

10. The apparatus according to claim 9 wherein the deflector device is a mirror.

* * * * *